United States Patent [19]

Zajac

[11] 4,418,646

[45] Dec. 6, 1983

[54] LOAD LOCK VALVE

[75] Inventor: John Zajac, San Jose, Calif.

[73] Assignee: Eaton Corporation, Cleveland, Ohio

[21] Appl. No.: 362,929

[22] Filed: Mar. 29, 1982

[51] Int. Cl.³ .............................................. C23C 13/08
[52] U.S. Cl. ....................................... 118/733; 118/50
[58] Field of Search ................................... 118/733, 50

[56] References Cited

U.S. PATENT DOCUMENTS

| | | | |
|---|---|---|---|
| 3,521,765 | 7/1970 | Kauffman et al. | 214/17 |
| 4,184,448 | 1/1980 | Aichert et al. | 118/733 X |
| 4,278,380 | 7/1981 | Guarino | 118/733 X |
| 4,338,883 | 7/1982 | Mahler | 118/733 X |

*Primary Examiner*—Michael R. Lusignan

*Attorney, Agent, or Firm*—C. H. Grace; F. M. Sajovec

[57] ABSTRACT

A valve (16) for use in a vacuum load lock for semiconductor processing equipment. The valve includes a base having a horizontal passage (34) formed through it for the transfer of semiconductor wafers (12) and a vertically moving valve element (50) received in a second passage (36) intersecting the first. The valve element includes a sealing element (62) which seals partly on a horizontal wall of the first passage and partly on a wall of the second passage, and is actuated by an air piston (56). A seal is effected between the pressurized and evacuated areas of the valve by means of a flexible diaphragm attached to the piston rod (48) and to the valve body (20, 22).

10 Claims, 3 Drawing Figures

U.S. Patent    Dec. 6, 1983    4,418,646
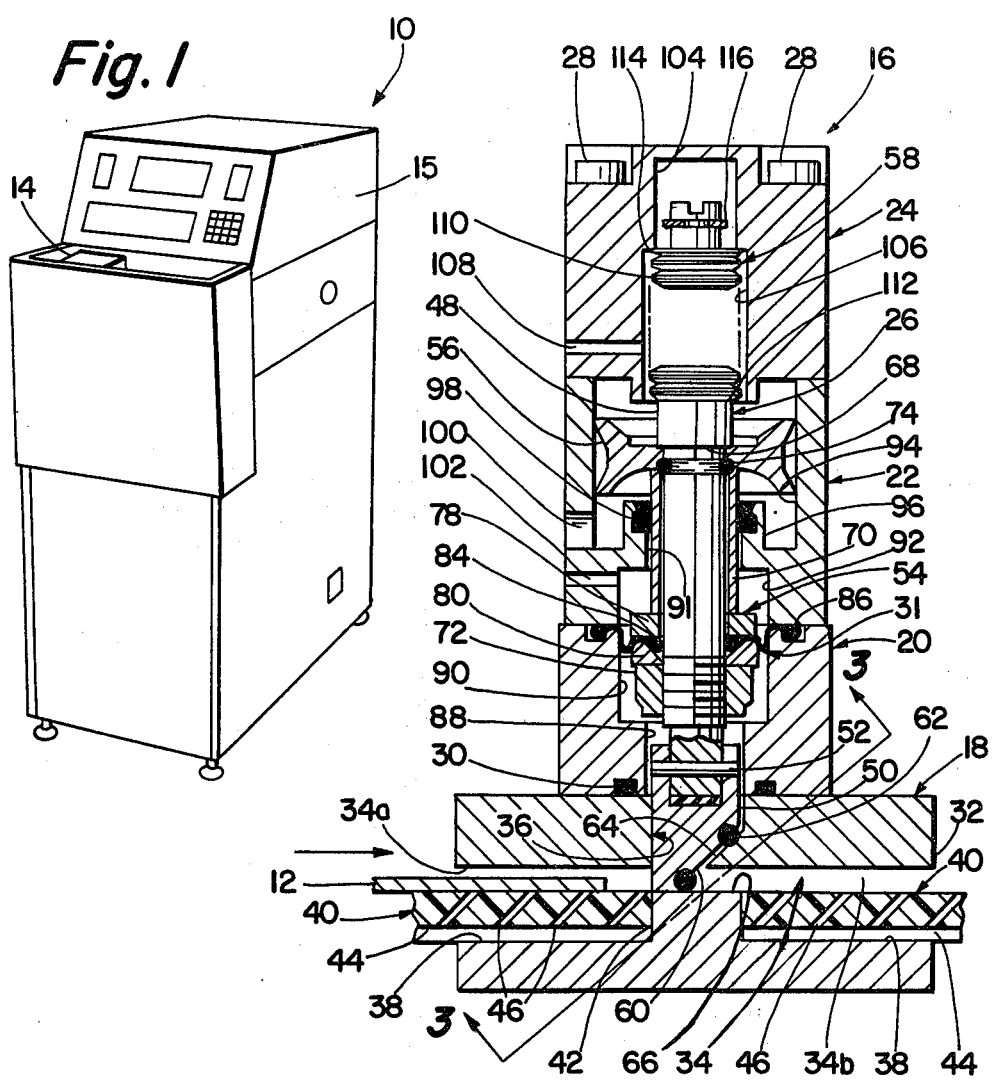
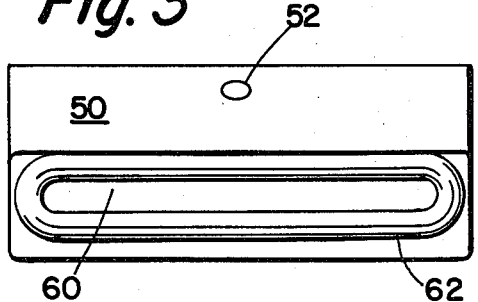

LOAD LOCK VALVE

The present invention relates generally to vacuum valves, and more particularly to a valve adapted for use in a load lock for an in-line semiconductor wafer processing apparatus.

In the processing of semiconductor wafers, more and more emphasis is being placed on high throughput in an effort to increase productivity. As a result, many processes which were formerly carried out in chambers wherein the substrates were loaded into and unloaded from the processing chamber in batches, are now being carried out in in-line apparatus, wherein the substrates are moved through the apparatus continuously or in stepwise fashion.

In-line processing is particularly difficult in a process which is carried out in a vacuum, such as plasma etching, since entry and exit load locks must be provided to allow the substrates to be moved between an atmospheric environment and a high-vacuum environment without losing the vacuum in the process chamber. Theoretically, a load lock is a straightforward piece of apparatus in that it includes an inlet valve structure, an outlet valve structure, and a lock chamber between the valves, with means being provided to pump down the lock chamber to a vacuum at least approaching that of the process chamber.

In the in-line processing of semiconductor wafers, the fact that a wafer is extremely fragile presents certain problems. More specifically, the configuration of a semiconductor wafer generally makes it advantageous to orient the wafers horizontally in moving them from point to point, which dictates that each of the valves used to define the vacuum load lock be in the form of a door or arm which opens and closes a slot through which the wafers enter and leave the load lock. It can thus be visualized that the door or arm structure must be opened and closed repeatedly as each wafer, or group of wafers, enters the lock, and that it is thus possible for the door to close on the wafer if precise timing between the operation of the door and the sequencing of the wafers moving into the lock is not maintained.

It can also be appreciated that sealing of the load-lock valve is very important. Among the known configurations of load-lock valves, one includes a vertically movable door structure which includes resilient seal elements which bear against a vertical wall of the lock structure. In this arrangement the door passes through the path of the wafer; therefore, if the door is inadvertently closed on a wafer, the wafer will break. In another form of prior art valve, the valve door moves into a closed position at an angle; however, the door still passes through the wafer path and will break a wafer which is in its path when it closes.

What the present invention provides is a valve structure in which the wafers pass through a horizontal slot formed in the valve structure, and in which the valve door moves vertically, but in which the sealing face of the valve door is disposed at an angle and includes a resilient sealing element which seals partly against a vertical wall portion of the vacuum chamber and partly against a platform defined by the bottom surface of the horizontal slot. There is no metal-to-metal contact between the valve door and the platform, and the valve door does not pass through the wafer path. If a door should close on a wafer only a resilient seal will contact the wafer and the design is such that the force applied to the wafer will be too low to cause breakage.

Other objects and advantages of the present invention will be apparent from the following description when considered in connection with the accompanying drawing, wherein:

FIG. 1 is a perspective view of a plasma etching apparatus incorporating the invention;

FIG. 2 is a cross-sectional view of the invention; and

FIG. 3 is an elevational view of the valve element of the invention taken along line 3—3 of FIG. 2.

Referring to FIG. 1, there is illustrated an apparatus 10 for processing semiconductor wafers which incorporates the present invention. In the illustrative embodiment the apparatus is a plasma etcher; however, it will be apparent that the present invention is applicable to any apparatus in which wafers are processed in a vacuum.

In the apparatus 10, wafers 12 (see FIG. 2) are sequentially removed from an input cassette 14 inserted into vacuum chamber 15 of the processing apparatus for processing, and then are inserted into an output cassette (not shown) when the process is complete. In a typical apparatus of this type, the wafers move stepwise through the vacuum chamber, so that it is necessary to provide a vacuum load lock at each end of the processing path so that the wafers can be transferred into and out of the vacuum chamber without losing the vacuum in the chamber. Accordingly, at each end of the vacuum chamber there is a lock chamber having an inlet valve and an outlet valve. To move a wafer into the vacuum chamber, the inlet valve is opened and the wafer is inserted into the lock chamber. When the wafer is in the lock chamber, the inlet and outlet valves are closed and the lock chamber is pumped down to suitable vacuum level. When the desired vacuum is reached, the outlet valve is opened and the wafer is inserted into the vacuum chamber. At the exit end of the vacuum chamber there is a similar load-lock arrangement with wafers passing from the vacuum chamber to a lock chamber through a first valve and from the lock chamber to atmosphere through a second valve.

All four load-lock valves can be essentially the same, and for purposes of this description the valve shown in FIG. 2 is the inlet valve to the load lock on the entrance side of the vacuum chamber. Referring to FIG. 2, the load-lock valve, designated generally by the numeral 16, comprises a base 18, a vacuum guide block 20 which is mounted on the base 18, a pressure guide block 22 mounted on the vacuum guide block, a pressure cap 24 mounted on the pressure guide block, and a movable valve assembly 26 received within the vacuum and pressure guide blocks. The vacuum guide block, pressure guide block and pressure cap are fastened to the base by means of a plurality of elongated bolts 28 which extend through each element and are threaded into the base. The interface between the vacuum guide block 20 and the base 18 is sealed by means of an O-ring 30, and the interface between the pressure guide block 22 and the vacuum guide block 20 is sealed by means of a diaphragm 31, which will be described in more detail later.

The base 18 as illustrated herein comprises a metallic block 32 having a horizontal slot 34 formed therein for passage of wafers through the valve, and a vertical channel 36 to receive a portion of the valve assembly 26. The block 32 also includes relieved areas or channels 38 to receive track elements 40 for transporting the wafers through the apparatus, the track elements in conjunction with a central, unrelieved portion 42 of the base block 32 defining a flat platform surface to receive the wafers. As shown here, the track elements 40 are part of an air-track system wherein the wafers are transported by jets of air or other gas flowing through channels 44 and angled orifices 46 formed in the tracks. It will be appreciated, however, that the air track is shown for illustrative purposes only, and forms no part of the present invention.

Referring to FIG. 2, the valve assembly 26 comprises an elongated shaft 48, a door or valve element 50 which is attached to the shaft by means of a pin 52, a diaphragm assembly 54 which is received over the shaft and serves to separate the pressure and vacuum elements of the valve, a piston cup 56 received over the shaft within the pressure guide block 22, and a spring assembly 58 which normally biases the valve assembly to the closed position shown in FIG. 2.

As is well known in the art, semiconductor wafers are typically 3" to 5" in diameter; therefore, the base 18, the slot 34, the channel 36 and the valve element 50 are elongated in a direction going into the drawing. Referring to FIGS. 2 and 3, the valve element 50 is a generally rectangular member having a seat surface 60 formed thereon at an angle, the seat surface having a groove formed therein to receive an elongated ring seal 62, which is preferably formed of an elastomeric material. The valve element 50 is received in the vertical channel 36, which is cut partially through the block 32 to form an angled seat surface 64 which is engaged by one side of the ring seal 62. The upper surface of the unrelieved area 42 of the block 32 defines a second seat surface 66, which is engaged by the other side of the ring seal 62.

The piston cups 56 surrounds shaft 48 and is received against a shoulder 68 formed on the shaft, and the cup is retained in that position by means of an elongated spacer tube 70 which fits over the shaft. The diaphragm assembly 54 is received against the spacer, and the piston cup, spacer and diaphragm assembly are all retained by means of a nut 72 which is threaded onto the shaft 48 and bears against the diaphragm assembly. A seal is effected between the shaft and the piston cup and between the shaft and the spacer by means of an O-ring 74 received in a groove formed in the shaft.

The diaphragm assembly 54 comprises an upper ring member 78, a lower ring member 80, and the diaphragm 31 which is received between them, the diaphragm being of the "rolling" type which will accommodate substantial axial displacement of the shaft. A seal is effected between the diaphragm assembly and the shaft by an inner ring portion 84 of the diaphragm, while an outer ring portion 86 effects a seal between the vacuum guide block 20 and the pressure guide block 22.

The vacuum guide block 20 is a generally rectangular member, and is elongated in a direction looking into the drawing to accommodate the valve element 50, the upper portion of which is received in a channel 88. A centrally-disposed, cylindrical bore 90 intersects the channel 88 and defines an operating volume for the diaphragm assembly 54.

The pressure guide block 22 is a rectangular block which is square in horizontal section. A first, relatively small vertical bore 91 is formed therein for passage of the shaft 48 and spacer 70, and the end abutting the vacuum guide block is counterbored at 92 to provide clearance for the diaphragm assembly. An enlarged bore 94 is formed in the opposite end to define, in combination with the piston cup 56, a pressure cylinder for actuating the valve. A boss 96 formed within the bore 94 receives a lip seal 98 which acts against the spacer 70. An air inlet port 100 is formed in the side of the block and opens into the bore 94 to provide means to introduce pressurized air for actuation of the valve, and a vent portion 102 is formed in the block opening into the counterbore 92.

The pressure cap 24 closes the valve structure and serves as a means to retain the valve assembly axially. The cap is formed with a first, closed bore 104, and a slightly enlarged counterbore 106. A vent port 108 is formed in a side wall of the block 24 and opens into the counterbore 106.

The spring assembly 58 comprises a plurality of stacked spring washers 110 received over the shaft 48 with the bottommost washer in engagement with a shoulder 112 formed on the shaft 48. The topmost washer is retained by a shoulder 114 defined by the intersection of the bore 104 and the counterbore 106. To retain the washers 110 prior to assembly of the valve, a retaining ring 116 is received within a groove formed adjacent the upper end of shaft 48 after the washers have been placed on the shaft. When the valve is assembled, the valve assembly, the vacuum guide block and the pressure guide block are put in position over the base after which the pressure cap is placed over the spring assembly and the bolts 28 are inserted through the cap and blocks and are threaded into the base. When the components are in their assembled position, spring assembly 58 is clamped between the shoulders 112 and 114 applying a preload to the spring washers, and thus biasing the valve assembly to a closed position, as shown in FIG. 2.

OPERATION

In discussing the operation of the valve 16, it is convenient to consider the slot 34 as being divided into a first slot 34a to the left of valve element 50 which is at atmospheric pressure, and a second slot 34b, to the right of valve element 50, which is subjected to a vacuum when the valve element is in the closed position shown. The area above the base 18 is also at atmospheric pressure. According, for purposes of illustration the slot 34a can be considered as representing the input from an indexer such as casette 14, and slot 34b can be considered as representing the interior of the input load lock to the vacuum chamber 15.

When a wafer 12 is to be moved from the indexer 14 to the load lock, pressurized air is applied to the inlet port 100. Since the air space above the piston cup 56 is vented to atmosphere by means of port 108, the excess pressure below the piston cup will cause the entire valve assembly 26 to move upward, against the preload of the spring assembly 58, thus lifting the valve element 50 off the valve seat surfaces 64 and 66 to permit passage of the wafer 12 through the slot 34.

Once a wafer, or group of wafers, is within the load lock, the air pressure is removed from port 100 and the air is exhausted from the cylinder, and the spring assembly 58 returns the valve assembly to the FIG. 2 position wherein the ring seal 62 is in sealing engagement with the angled seat surface 64 and the second seat surface 66. When the valve assembly moves downward, air trapped in the space between the diaphragm 82 and the lip seal 98 is vented to atmosphere through port 102.

Because of the angled configuration of the valve element 50 and the location of the ring seal thereon, the closing force of the valve element is distributed between the seat surfaces 64 and 66 and there is no metal-to-metal contact between the valve element and the wafer platform represented by the bottom of the slot 34. Therefore, if a wafer should be under the valve element when it is closed, the contact pressure applied to the wafer surface will be too low to break it.

I claim:

1. In apparatus for processing semiconductor wafers including a first chamber operable at a first pressure, a second chamber operable at a second pressure, and a conduit for the passage of semiconductor wafers from said first chamber to said second chamber; a valve operable to selectively open and close said conduit comprising a base; a first passage formed through said base defining a portion of said conduit; a seat surface formed on a wall of said first passage over which said wafers pass; a second passage substantially perpendicular to and intersecting said first passage; a valve element received in said second passage and movable between a first position closing said first passage and a second position opening said first passage, said valve element having a seal element thereon having a first sealing surface engageable with said seat surface and a second sealing surface engageable with a wall of said substantially perpendicular second passage when said valve element is in its first position; and actuating means operable to move said valve element between said first and second positions.

2. Apparatus as claimed in claim 1, in which said valve element has a surface formed thereon at an angle to the horizontal, said seal element being received on said angled surface.

3. Apparatus as claimed in claim 2 in which said seal element is defined by an elastomeric ring received in a groove formed in said angled surface.

4. Apparatus as claimed in claim 1, in which said actuating means comprises an air cylinder mounted on said base and having a reciprocal piston rod attached to said valve element.

5. Apparatus as claimed in claim 4, in which said air cylinder comprises a body, a first bore formed in said body intersecting said second passage, a second enlarged bore formed in said body coaxial with said first bore, a piston-rod assembly received in said first bore, means attaching one end of said piston-rod assembly to said valve element, a piston attached to said piston-rod assembly and slideably received in said second bore, means biasing said piston-rod assembly to a position corresponding to the first position of said valve member, and air inlet means opening into said second bore to permit pressurized air acting on said piston to move said piston-rod assembly against the force of said biasing means to a position corresponding to the second position of said valve member.

6. Apparatus as claimed in claim 5, including sealing means acting between said piston rod assembly and said body and disposed along said piston rod assembly between said piston and said valve element.

7. Apparatus as claimed in claim 6, in which said sealing means comprises an elastomeric diaphragm having an inner portion attached to said piston-rod assembly and an outer portion attached to said body.

8. Apparatus as claimed in claim 1, in which only a portion of said second passage intersects said first passage, the non-intersecting portion thereof defining a lower wall of said second passage disposed at an angle and extending between the upper wall of said first passage and a side wall of said second passage.

9. Apparatus as claimed in claim 8, in which said valve element has a seat surface formed thereon at an angle corresponding to the angle of said lower wall, said valve element including a seal element thereon having a first sealing surface acting between said angled seat surface and said lower wall of said second passage and a second sealing surface acting on the seat surface formed on the wall of said first passage.

10. Apparatus as claimed in claim 9, in which said seal element is defined by a continuous elastomeric ring received in a groove formed in said valve element.

* * * * *